United States Patent
Lee

(10) Patent No.: US 12,125,732 B2
(45) Date of Patent: Oct. 22, 2024

(54) HIGH DENSITY CORROSION RESISTANT LAYER ARRANGEMENT FOR ELECTROSTATIC CHUCKS

(71) Applicant: Morgan Advanced Ceramics, Inc., Hayward, CA (US)

(72) Inventor: Chengtsin Lee, Hayward, CA (US)

(73) Assignee: Morgan Advanced Ceramics, Inc., Hayward, CA (US)

( * ) Notice: Subject to any disclaimer, the term of this patent is extended or adjusted under 35 U.S.C. 154(b) by 356 days.

(21) Appl. No.: 17/602,320

(22) PCT Filed: Apr. 10, 2020

(86) PCT No.: PCT/US2020/027618
§ 371 (c)(1),
(2) Date: Oct. 8, 2021

(87) PCT Pub. No.: WO2020/214494
PCT Pub. Date: Oct. 22, 2020

(65) Prior Publication Data
US 2022/0199451 A1    Jun. 23, 2022

Related U.S. Application Data

(60) Provisional application No. 62/836,277, filed on Apr. 19, 2019.

(30) Foreign Application Priority Data
May 3, 2019 (GB) ...................................... 1906266

(51) Int. Cl.
*H01L 21/683* (2006.01)
*C04B 35/486* (2006.01)
(Continued)

(52) U.S. Cl.
CPC ........ *H01L 21/6833* (2013.01); *C04B 35/486* (2013.01); *C04B 35/505* (2013.01);
(Continued)

(58) Field of Classification Search
CPC . H01L 21/6833; C04B 35/486; C04B 35/505; C04B 35/565; C04B 37/006;
(Continued)

(56) References Cited

U.S. PATENT DOCUMENTS 4,678,683 A    7/1987 Pasco et al.
5,104,834 A    4/1992 Watanabe et al.
(Continued)

FOREIGN PATENT DOCUMENTS

KR        101475860 B1    12/2014

OTHER PUBLICATIONS

Machine Translation of KR101475860B1, 13 pages.
PCT International Search Report and Written Opinion in PCT/US20/27618 dated Aug. 17, 2020, 20 pages.

*Primary Examiner* — Yemane Mehari
(74) *Attorney, Agent, or Firm* — Servilla Whitney LLC

(57) ABSTRACT

A layer arrangement for an electrostatic chuck comprises a first ceramic layer; a second ceramic layer; a metallised layered disposed between the first and second ceramic layers. The first ceramic layer comprises at least 90.0 wt % alumina, titania, $ZrO_2$, $Y_2O_3$, AlN, $Si_3N_4$, SiC, transition metal oxides or combinations thereof; and in the range of 0.1 to 10.0 wt % tantalum oxide ($Ta_2O_5$).

25 Claims, 7 Drawing Sheets

(51) Int. Cl.
- *C04B 35/505* (2006.01)
- *C04B 35/565* (2006.01)
- *C04B 35/581* (2006.01)
- *C04B 35/584* (2006.01)
- *C04B 35/645* (2006.01)
- *C04B 37/00* (2006.01)

(52) U.S. Cl.
CPC .......... *C04B 35/565* (2013.01); *C04B 35/581* (2013.01); *C04B 35/584* (2013.01); *C04B 35/645* (2013.01); *C04B 37/006* (2013.01); *C04B 2235/77* (2013.01); *C04B 2235/96* (2013.01); *C04B 2237/122* (2013.01); *C04B 2237/346* (2013.01); *C04B 2237/348* (2013.01); *C04B 2237/365* (2013.01); *C04B 2237/366* (2013.01); *C04B 2237/368* (2013.01); *C04B 2237/68* (2013.01)

(58) Field of Classification Search
CPC ............ C04B 2235/77; C04B 2235/96; C04B 2237/122; C04B 2237/346; C04B 2237/348; C04B 2237/365; C04B 2237/366; C04B 2237/368; C04B 2237/68
USPC ...................................................... 361/234
See application file for complete search history.

(56) References Cited

U.S. PATENT DOCUMENTS

| | | |
|---|---|---|
| 5,207,437 A | 5/1993 | Barnes et al. |
| 5,671,116 A | 9/1997 | Husain |
| 6,641,939 B1 | 11/2003 | Lee et al. |
| 9,721,822 B2 * | 8/2017 | Sasaki ............... H01L 21/67248 |
| 2002/0135969 A1 * | 9/2002 | Weldon .................. H01J 37/321 |
| | | 361/234 |
| 2008/0151467 A1 * | 6/2008 | Simpson ............. H01L 21/6833 |
| | | 279/128 |
| 2010/0055494 A1 * | 3/2010 | Gillesberg .............. C23C 10/34 |
| | | 427/124 |
| 2017/0057880 A1 * | 3/2017 | Ahrendes ................ B32B 18/00 |
| 2018/0204747 A1 * | 7/2018 | Knyazik .................. C09K 5/14 |

* cited by examiner

HIGH DENSITY CORROSION RESISTANT LAYER ARRANGEMENT FOR ELECTROSTATIC CHUCKS

CROSS-REFERENCE TO RELATED APPLICATIONS

This application is the National Stage entry of PCT/US2020/027618, filed on Apr. 10, 2020, which claims priority to U.S. Provisional Application Ser. No. 62/836,277, filed Apr. 19, 2019, and GB Application Serial No. 1906266.0 filed May 3, 2019, the entire disclosures of which are hereby incorporated by reference herein.

FIELD

The present disclosure relates to a layer arrangement for an electrostatic chuck; a method of manufacture thereof; and electrostatics chucks containing said layer arrangement. In particular, the disclosure relates to a metallisation layer disposed between a top dielectric layer and an insulation layer in an electrostatic chuck.

BACKGROUND

Electrostatic chucks (ESC) are extensively used to clamp down substrates such as silicon wafers in semiconductor device fabrication processes. ESCs are layered structures where electrically conductive layers are sandwiched between ceramic insulators to prevent them coming in direct contact with the devices. Alumina and aluminium nitride are the mostly used ceramics in ESC. The conductive layers, often called "traces" or "electrodes", are typically made from refractory metals such as molybdenum and tungsten. The traces are further connected by inter layer conductive conduits called "vias" which pass through the ceramic layers to provide electrical energy from external power sources.

U.S. Pat. No. 5,671,116 teaches a co-firing methodology for manufacturing ceramic ESCs. In this process, ceramic tapes first are formed by tape casting powders which are mixed with various organic and inorganic binders to hold them together. The conductive traces are then metallised on top of the ceramic tapes in a green state. The metallised green tapes are then stacked on top of each other and then pressed to laminate them. The vias are formed by inserting refractory metal paste or powders in the vias holes drilled in the ceramic layers. The resulting laminated green part is then co-fired at high temperature to make a monolithic ESC body.

The top ceramic layer on the ESC often called the dielectric layer which comes in direct contact with the wafer is the most critical ceramic layer in the ESC. Its primary function is to provide an insulating layer between the wafer and the underneath electrode. Its dielectric strength must withstand the breakdown force of the electrical field applied to clamp the wafer. It also protects any metallic impurities migrating from the electrode material to the device while being processed. In process chambers, such as etch and deposition, harsh gases such as fluorine and chlorine are used which are becoming increasingly corrosive in nature. In such cases, it is paramount that the composition of the ceramic layers must not get dissolved by the corrosive process gases and contaminate the device.

In order to maintain a high dielectric breakdown strength, the ceramic must be near fully dense. U.S. Pat. Nos. 4,678,683, 5,207,437 and 5,104,834 all disclose use of silica with calcia and magnesia as liquid phase sintering aid to densify ceramics during sintering of layered metallised structures. Although such compositions in alumina give dense sintered body, they have some pitfalls:
  the compositions are attacked by halogen plasma gases such as fluorine and chlorine during semiconductor fabrication processes; and
  the compositions have a relatively high impurity content related to the liquid phase formation. The high impurity content makes the compositions not suitable for high temperature processing environments as the impurities are more susceptible to mitigation through the dielectric layer; and into the gaseous processing environment and detrimentally onto the surface of the silicon wafers.

Therefore, there is a need to develop an ESC which is both corrosive resistant and resistant to the mitigation of impurities into the processing environment.

SUMMARY

In a first aspect, there is provided a layer arrangement for an electrostatic chuck comprising:
  A. a first ceramic layer;
  B. a second ceramic layer;
  C. a metallised layered disposed between the first and second ceramic layers,
  wherein the first ceramic layer comprises at least 90.0 wt % of:
    (i) alumina, titania, $ZrO_2$, $Y_2O_3$, AlN, $Si_3N_4$, SiC, or combinations thereof; or
    (ii) alumina doped with a transition metal oxide; and
  preferably sufficient tantalum oxide ($Ta_2O_5$) to densify the first ceramic layer to at least 97% or 98% or 98.5% or 99.0% of the theoretical maximum density of the first ceramic layer (i.e. 0% porosity). Tantalum oxide ($Ta_2O_5$) is preferably present in the range of 0.05 to 10.0 wt %.

In some embodiments, it has been found that relatively small amounts of tantalum oxide (e.g. less than 2.0 wt %), used as a sintering aid, is able to be produce a high density, high purity ceramic. In these embodiments, the first ceramic layer preferably comprises at least 90.0 wt % of alumina, titania, $ZrO_2$, $Y_2O_3$, AlN, $Si_3N_4$, SiC, or combinations thereof In other embodiments, more $Ta_2O_5$ may be required (e.g. 2.0 wt % to 6.0 wt % or 10 wt % or more) to form a $Ta_2O_5$ liquid phase to densify the first ceramic layer. In these embodiments, the first ceramic layer preferably comprises at least 90.0 wt % of alumina doped with transition metal oxides, such as titania.

$Ta_2O_5$ is highly inert in most environments and thus has a low tendency to mitigate into the processing environment. The processing environment may be above 450° C. or above 550° C. or above 650° C. or above 750° C.

Preferably, there is at least 92.0 wt % or at least 94.0 wt % or at least 96.0 wt % or at least 98.0 wt % or at least 99.0 wt % of alumina, titania, $ZrO_2$, $Y_2O_3$, AlN, $Si_3N_4$, SiC, transition metal oxides or combinations thereof.

The first layer may comprise at least 95.0 wt % or at least 97.0 wt % or at least 98.0 wt % or at least 99.0 wt % or at least 99.5 wt % or at least 99.8 wt % of tantalum oxide and alumina, titania, $ZrO_2$, $Y_2O_3$, AlN, $Si_3N_4$, SiC, transition metal oxides or combinations thereof.

The first ceramic layer preferably comprises alumina or AlN.

The first ceramic layer preferably comprises less than or equal to 8.0 wt % $Ta_2O_5$ or less than or equal to 6.0 wt % or less than or equal to 4.0 wt % $Ta_2O_5$ or less than or equal to 2.0 wt % or less than or equal to 1.5 wt % $Ta_2O_5$ or less than or equal to 1.0 wt % or less than or equal to 0.8 wt % $Ta_2O_5$ or less than or equal to 0.7 wt % or less than or equal to 0.6 wt % $Ta_2O_5$ or less than or equal to 0.5 wt % or less than or equal to 0.4 wt %. Preferably, the first ceramic layer comprises greater than or equal to 0.2 wt % $Ta_2O_5$ or greater than or equal to 0.3 wt % $Ta_2O_5$. The amount of $Ta_2O_5$ required may depend upon the composition of the first ceramic layer; the required target density and/or the target sintering temperature and time; as well as the processing environment the layer arrangement will be exposed to. Higher levels of $Ta_2O_5$ may not provide significant additional benefit in the densification process; while lower levels may not be sufficient to provide the targeted density requirements at the target conditions.

Preferably, the first ceramic layer is a top dielectric layer. The top dielectric layer may come into direct contact with the wafer in the processing chamber and thus the surface of the dielectric layer is preferably substantially free of volatile impurities species (e.g. Cu and Na).

Preferably, the first ceramic layer comprises a $Ta_2O_5$ phase at the interface of the first ceramic layer and the metallised layer.

In one embodiment, during a co-firing process in the manufacture of the layered arrangement, the layered arrangement is heated to below the melting point of $Ta_2O_5$ for a set period of time, resulting in the formation of a liquid $Ta_2O_5$-alumina phase which is drawn towards the more porous region around the metallisation layer and the adjacent second ceramic layer. Preferably, $Ta_2O_5$ is able to form a liquid phase within the first ceramic layer at or below 1600° C. and more preferably at or below 1400° C.

As a result, the $Ta_2O_5$ concentration at a top surface of the top dielectric layer ($Ta_2O_5$ deficient phase) has a lower $Ta_2O_5$ concentration than a $Ta_2O_5$ phase (e.g. glass) at an interface of the first ceramic layer and the metallised layer. Preferably, the $Ta_2O_5$ concentration at the top surface of the first ceramic layer is at least 20% or 50% of 80% lower than the $Ta_2O_5$ concentration in the $Ta_2O_5$ phase at the interface between the metallisation layer and the first ceramic layer. This distribution of the $Ta_2O_5$ is advantageous, as while $Ta_2O_5$ is not reactive to most gaseous environments, it is susceptible to react with fluorine gas. Therefore, the surface in direct contact with the gaseous environment is lower in $Ta_2O_5$. Furthermore, in embodiments, in which the ceramic oxide used is alumina, it is thought that $Ta_2O_5$ forms an alumina based glass which may be more corrosive resistant to fluorine gas, than $Ta_2O_5$ alone.

In some embodiments, the cross sectional area of the tantalum phases proximal the metallisation layer (e.g. a minimum sample cross sectional area of approximately 300 $\mu m^2$ or more (e.g. 20 $\mu m \times 15$ $\mu m$) at a maximum point of no more than 30 $\mu m$ from the metallisation layer) has greater than 20% or greater than 40% or greater than 80% or greater than 100% or greater than 150% or greater than 200% the cross sectional area of the tantalum phases proximal the surface of the top dielectric layer (e.g. a minimum sample cross sectional area of approximately 300 $\mu m^2$ or more (e.g. 20 $\mu m \times 15$ $\mu m$) at a maximum point of no more than 30 $\mu m$ from the surface).

The $Ta_2O_5$ phase has a relative high melting point and a relative low vapour pressure. Not only is the $Ta_2O_5$ phase corrosive resistant and non-volatile at temperature up to 1000° C. or higher, it forms a barrier to prevent more volatile impurities mitigating through first ceramic layer and into the processing chamber. Thus, the layer arrangement has the benefit of being able to reliably operate in a high temperature corrosive environment whilst not contaminating the wafer in the production of semiconductors.

In particular, in non-etch application such as ion-implant chambers tantalum oxide doped alumina ESCs give a much cleaner processing environment as $Ta_2O_5$ has a lower vapour pressure compared to other binders such as magnesia and calcia.

The inert nature of the ESC with a $Ta_2O_5$ dielectric top layer within corrosive gaseous also enables the ESC to maintain its mechanical integrity over longer period of time, compared to conventional ESCs.

The formation of liquid $Ta_2O_5$ phase during high temperature sintering also helps bond with the ceramic layers to the metallised layer(s), thus preventing delamination of the different layers in the ESC.

The thickness of the first ceramic layer is typically between 10 $\mu m$ and 1.0 mm or between 20 $\mu m$ and 500 $\mu m$ or between 30 $\mu m$ and 400 $\mu m$ or between 40 micron and 300 $\mu m$ or between 50 $\mu m$ and 200 $\mu m$, including all sub-ranges and values therebetween depending upon the specific application and the composition of the first ceramic layer. When the first ceramic layer is a top dielectric layer for an ESC used in the ion implantation process, then the dielectric layer is required to withstand a voltage range of 500V to 2000V. For ESC used in etching or deposition processes, then the dielectric layer may be required to withstand a voltage of 3000V to 6000V, preferably 1000V to 3000V.

In one embodiment, the top dielectric layer has a breakdown voltage of at least 60 V/$\mu m$ or at least 70 V/$\mu m$ or at least 80 V/$\mu m$.

For an $Al_2O_3$ (99.5 wt)-$Ta_2O_5$ (0.5 wt %) dielectric layer, the dielectric breakdown voltage is approximately 2000 V/mil or 80 V/$\mu m$. When a safety margin is added, the approximate thickness of the dielectric layer may be between 10 $\mu m$ or 20 $\mu m$ and 200 $\mu m$. The superior dielectric breakdown strength of the layer arrangement of embodiments herein enables a thinner dielectric layer to be used for the same application voltage compared to convention high purities dielectric layers, such as Al-995™ and Al-998™ (available from Morgan Advanced Ceramics, Hayward, CA).

The density of the first ceramic layer is preferably greater than 97%, more preferably greater than 98% and even more preferably greater than 99% of the theoretical maximum density of the ceramic material with a porosity of 0%. Alternatively, the void content of the first ceramic layer is preferably less than 3% v/v, more preferably less than 2% v/v and even more preferably less than 1% v/v.

The density of the first ceramic layer is may be greater than 3.90 g/cm$^3$ or greater than 3.91 g/cm$^3$ or greater than 3.92 g/cm$^3$ or greater than 3.93 g/cm$^3$ or greater than 3.94 g/cm$^3$ or greater than 3.95 g/cm$^3$.

The density of the second ceramic layer is preferably lower than the density of the first ceramic layer. The second ceramic layer preferably comprises at least 95 wt % and more preferably at least 95 wt % alumina, titania, $ZrO_2$, $Y_2O_3$, AlN, $Si_3N_4$, SiC, or combinations thereof.

The ceramic material forming the first and second layers preferably has a mean particle size of between about 0.5 and 5 $\mu m$ and more preferably between 1 and 3 $\mu m$.

The first and the second ceramics layers preferably comprise the same ceramic components. In a preferred embodiment, the first and the second ceramic layers comprise alumina. Within this embodiment, the second ceramic layer preferably has a high alumina content (e.g. Al-998™). The higher purity alumina is more difficult to sinter and densify, due to the substantial absence of a sintering aid. As such, the density of the second ceramic layer is generally lower than the first ceramic layer and therefore facilitates the mitigation of the liquid $Ta_2O_5$ phase towards and into the second ceramic phase. The mitigation of the liquid $Ta_2O_5$ phase into the second ceramic phase may only be adjacent the metallisation layer interface (i.e. not extend throughout the whole second ceramic layer).

In another embodiment, the first ceramic layer comprises an electrostatic charge dissipative material comprising alumina doped with a transition metal oxide and between 0.1 wt % or 0.5 wt % and 10.0 tantalum oxide ($Ta_2O_5$). The transition metal oxide is preferably present in an amount ranging from 1.0 wt % and 8.0 wt % (preferably ranging from 1.5 wt % to 7.5 wt % or ranging from 2.0 wt % to 7.0 wt %) based upon the total weight of the ceramic material in the first ceramic layer. Within this embodiment, the alumina doped with a transition metal oxide preferably accounts for at least 90 wt % of the first ceramic layer.

The doping of the alumina enables the resistivity of the doped alumina to be controlled, as disclosed in U.S. Pat. No. 6,641,939, which is incorporated therein by reference.

The transition metal oxide may be selected from the group consisting of oxides of Re, Ti, V, Fe, Cr, Co, Mn, Ni, Mo and Nb. The transition metal oxide is preferably titania.

The continuity of the grain boundary phases as well as the wetting angle of a $Ta_2O_5$-titanate liquid phase is thought to control the resistivity of the doped alumina. Higher amount of $Ta_2O_5$ were required to be added to titania doped alumina, compared to high purity alumina, to form the $Ta_2O_5$-titanate liquid phase at a co-firing temperature at or below 1600° C. (e.g in the range of 2.0 wt % to 10 wt % $Ta_2O_5$).

In embodiments comprising a transition metal oxide doped alumina first ceramic layer, the first ceramic layer preferably has a breakdown voltage of at least 20 V/μm or at least 30 V/μm or at least 40 V/μm.

In a second aspect, there is provided an electrostatic chuck comprising the layered arrangement of the first aspect.

In a third aspect, there is provided a method of manufacturing a layer arrangement for an electrostatic chuck comprising the steps of:
  A. forming a first or a second ceramic layer to create a base layer in the green state;
  B. applying a metallised layer to the base layer;
  C. disposing the first or the second ceramic layer over the metallised layer to form a top layer in the green state; said first ceramic layer, in the co-fired state, comprises: at least 90 wt % alumina, titania, $ZrO_2$, $Y_2O_3$, AlN, $Si_3N_4$, SiC, transition metal oxides or combinations thereof; and sufficient tantalum oxide ($Ta_2O_5$) to densify the first ceramic layer to at least 97% or 98% or 98.5% or 99.0% of the theoretical density of the first ceramic layer. The tantalum oxide ($Ta_2O_5$) is preferably in the range of 0.1 to 10.0 wt %
  D. co-firing the layers at sufficient temperature and time to form a liquid $Ta_2O_5$ phase,
wherein the liquid $Ta_2O_5$ phase migrates towards the interfaces between the first ceramic layer; the metallisation layer and the second ceramic layer.

In a fourth aspect, there is provided a method of manufacturing a layer arrangement for an electrostatic chuck comprising the steps of:
  A. forming a base layer comprising a first material in a green state;
  B. applying a refractory metallisation-forming material to the base layer to form a metallisation layer;
  C. disposing a top layer comprising a second material in a green state over the metallisation layer;
  D. co-firing the base, metallisation, and top layers at sufficient temperature and time to form a liquid $Ta_2O_5$ phase,
    wherein the liquid $Ta_2O_5$ phase migrates towards interfaces between the top layer; the metallisation layer and the base layer; and
    in the co-fired state, the top layer comprises a first ceramic material comprising: at least 90.0 wt % alumina, titania, $ZrO_2$, $Y_2O_3$, AlN, $Si_3N_4$, SiC, or combinations thereof; and in the range of 0.1 to 10.0 wt % tantalum oxide ($Ta_2O_5$).

Other methods of forming the layer arrangement are possible, e.g. using an adhesive to bond the layers together, rather than co-firing. However, co-firing is generally preferred as it promotes a $Ta_2O_5$ concentration gradient from the surface of the top layer to the metallisation layer to thereby:
  create a barrier at or proximal the metallisation layer to prevent the mitigation of volatile impurities towards the surface of the dielectric layer;
  create a bonding layer between the dielectric layer and the metallisation layer to prevent the delamination of the dielectric layer and the metallisation layer; and
  provide an inert dielectric layer surface which is substantially free of volatile impurities, which is able to operate in atmosphere critical environments, such as in ion-implant chambers.

Preferably, the second ceramic layer is the base layer and the first ceramic layer is the top layer.

Additional layers (e.g. a heater layer) may be added to the arrangement prior to co-firing. The additional layers are preferably added to the base layer, thereby maintaining the first ceramic layer as the top layer.

The interface between the metallisation layer and adjacent ceramic layers is prone to delamination due and void formation due, in part, to a mis-match in thermal expansion or and/void formation. The liquid $Ta_2O_5$ phase in the first ceramic layer mitigates towards the metallisation layer interfaces to form a more secure bond between the metallisation layer and the adjacent ceramic layers.

Typically, the temperature and time to densify the first ceramic layer to greater than 97.0 wt % of the theoretical maximum density of the first ceramic layer is sufficient for the liquid $Ta_2O_5$ phase to improve the adhesion of the metallisation layer. However, maintaining the co-firing conditions for extended times (e.g. greater than 1 hour or greater than 2 hour) may have further positive effect. An extended co-firing time may also result in the surface of the first ceramic layer having reduced levels of $Ta_2O_5$ compared to the surface in the green state, due to the mitigation of the $Ta_2O_5$ phase. Lower levels (e.g. 10% or 20% or 50% less compared to the surface in the green state) of $Ta_2O_5$ in the surface layer results in a surface suitable for applications in chlorine ($Cl_2$ and $BCl_3$) gas environments or even fluorine gas environments.

Preferably, a density of the second ceramic layer is lower than a density of the first ceramic layer during the densification process, as a higher void content in the second ceramic phase, as well as around the layer boundaries, promotes mitigation of the liquid $Ta_2O_5$ phase towards the second ceramic layer.

The first and second ceramic layers may be from by any suitable technique including dried pressing or tape casting. In one embodiment, the second layer is formed through dry pressing and the first layer it tape cast. Details of such a process are provided in US20170057880 which is incorporated herein by reference. Tape casting is preferably used for when the dielectric layer has a thickness of less than 200 µm and more preferably less than 100 µm.

The thickness of the second ceramic green layers can vary widely depending largely on its particular application. Generally, however, its thickness ranges from about 0.1 mm to about 5 mm. Preferably, the green ceramic layer is of uniform or at least of substantially uniform thickness.

Metallisation

The metallisation layer may comprise a refractory metallisation-forming material, i.e. during co-firing the refractory metallisation-forming material forms the electrically conductive refractory metal phase on the substrate. Generally, the metallisation forming material is known in the art and is available commercially. The metallisation forming material preferably has a melting temperature significantly below the co-firing temperature (e.g. 50° C. or 100° C. below). The metallisation material is preferably a metal selected from the group consisting of platinum, palladium, tungsten, molybdenum, niobium, tantalum and alloys thereof.

Usually the metallisation forming material is in the form of a paste or ink comprising refractory metal particles suspended in organic binder and solvent. The metallisation material may also contain some glass forming components (e.g. $SiO_2$, $MgCO_3$, Kaolin) which further aids in the adherence of the metal to the substrate. However, as the formed liquid $Ta_2O_5$ phase may improve adherence of the metallisation layer to the substrate, such additions are optional.

Generally, the refractory metal particles range in size from about 0.1 micron to about 20 microns.

The refractory metal can be any metal whose particles can be sintered together during sintering of the present sinterable ceramic composition to produce a continuous electrically conductive phase. The refractory metal must be a solid during sintering of the ceramic composition, and preferably, it is tungsten or molybdenum.

The metallisation material can be contacted with the ceramic layer by a number of conventional techniques. Generally, it is deposited or printed thereon and/or therein in a preselected electrostatic chuck electrode pattern. Usually, it is screen printed thereon.

Fabrication

In the fabrication of a monolithic body having a multi-layered ceramic substrate, a plurality of green ceramic layers are produced and the metallisation material is contacted with or printed on most, if not all, of them in a preselected pattern. Vias or feed-through holes may be punched in the sheets as required for layer interconnection and filled with the metallisation material usually in the form of a paste. The sheets are then stacked together, i.e. superimposed on each other, in a preselected manner generally forming a sandwich. The stack can be laminated under a pressure and temperature determinable largely by its particular composition, but usually lower than about 100° C., to form a laminated structure which is then co-fired.

After applying metallization paint, isostatic pressing may be used to assemble multiple layers of green tapes and/or dry pressed green sheets. Typical pressures are up to about 103 MPa (15 k psi) but higher pressure may be used as required. Isostatic pressing not only produces good lamination between tapes but also ensures a uniform shrinkage of the multilayer tape structure during firing.

When the fired laminated assembly is used as an electrostatic chuck, the exterior surface or face of the co-fired ceramic part would need to be substantially flat so as to ensure that there is maximum surface area contact between the substrate wafer and the support surface of the dielectric layer. In order to provide the flatness of the co-fired ceramic part, a method of flat firing a layered arrangement comprises the steps of;
  a) supporting the layered arrangement on an insulating setter having at least one substantially flat surface;
  b) mounting or assembling an insulating weight having at least one substantially flat surface on the layered arrangement such that the layered arrangement lies between the substantially flat surface of the insulating setter and the insulating weight.

Steps (a) and (b) are then fired to the sintering temperature in an inert (e.g. $N_2$) or reducing gaseous environment (e.g. $H_2$). Preferably, the at least one surface of the setter and/or weight adjacent the article are machined substantially flat. By machining at least one face of the setter and/or the weight that is in contact with the green article substantially flat, the green layered arrangement will either maintain its flatness or take up the flatness of the surface of the setter and/or weight during firing. For example, in the latter case, where the green layered arrangement, as a result of its forming process such as dry pressing or iso-pressing or even handling is not perfectly flat or has imperfections, by firing the green layered arrangement between substantially flat surfaces of the setter and the weight, the pressure applied by the weight causes the layered arrangement to substantially take up the flatness of the flat surfaces of the setter and/or weight.

The present structure is preferably co-fired to produce a sintered structure comprised of a sintered ceramic substrate free of voids greater than about 5 microns and an adherent electrically conductive phase of refractory metal.

During sintering, the first ceramic layer preferably comprises a $Ta_2O_5$ liquid-phase for producing a ceramic substrate of desired density. Preferably, the $Ta_2O_5$ liquid-phase bonds the sintered metal particles to the adjacent ceramic layers. During sintering, a portion of the liquid phase which enables sintering of the ceramic migrates into the interstices between the sintering refractory metal particles by capillarity resulting in a phase, usually a glassy phase, intermingled with the continuous phase of refractory metal which aids in the adherence of the refractory metal phase to the substrate. The sintering temperature can vary widely depending largely on the particular ceramic composition, but generally it is above 1300° C. and usually ranges from about 1350° C. to about 2100° C. For example, for a sinterable liquid phase $Ta_2O_5$-alumina composition, a sintering temperature from about 1500° C. to about 1600° C. is typical.

Further details on the processing of components to form an electrostatic chuck may be found in US20170057880 which is incorporated herein by reference.

Tantalum is expressed as an oxide form ($Ta_2O_5$) for convenience and it will be understood that tantalum may be present in other forms.

DETAILED DESCRIPTION OF A PREFERRED EMBODIMENT

Figure 1:
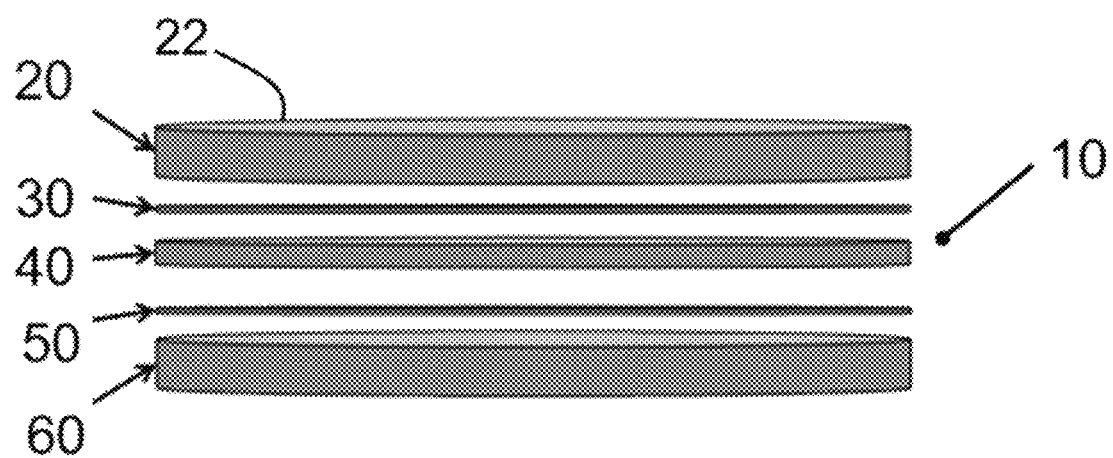
FIG. 1 is an exploded view of a layer arrangement forming an electrostatic chuck (not to scale).

With reference to FIG. 1, there is a electrostatic chuck 10 of 300 mm diameter comprising a top dielectric layer 20 having a top surface 22 formed from dry pressing having a thickness of 150 µm; an electrode layer 30 (20 µm) comprising a molybdenum based paint composition, a dry pressed insulating layer 40 of about 50 µm thickness; a heater layer (20 µm) 50 comprising a molybdenum based paint composition; and a base layer having a thickness of 150 µm.

Each of the dielectric layer 20, insulating layer 40 and base layer 60 comprised high purity alumina. The dielectric layer 20 comprised 99.5 wt % $Al_2O_3$, 0.5 wt % $Ta_2O_5$ and trace level of impurities. Both the thin insulating layer 40 and base layer 60 were formed from alumina powder having a nominal purity of 99.8 wt % $Al_2O_3$ (Al-998™). Other suitable alumina powders include Al-995™. A high purity alumina forms the basis for alumina formulations (Al-998™, AL-995™ and the E-1 formation), with the alumina particles having a mean particle size~1.2 µm; surface area~3.5 m²/g).

The ceramic layers were dry pressed using sprayed dried alumina; binders, dispersant and other additives as described in US20170057880, paragraphs 57 to 62.

Figure 2:
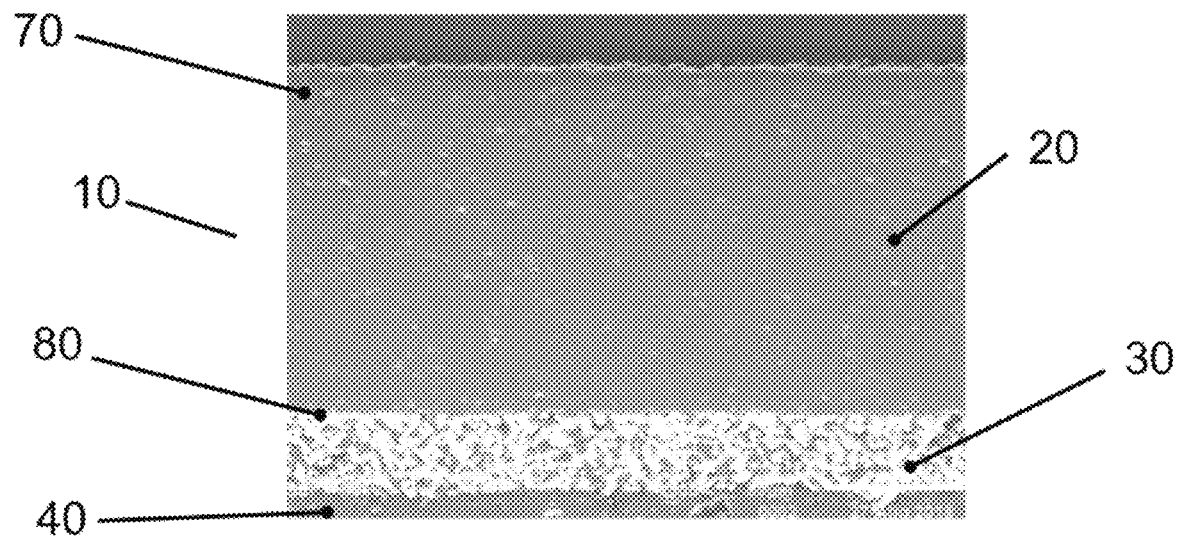
FIG. 2 is a SEM image of a first ceramic layer (top); a metallisation layer; and a second ceramic layer according to an embodiment.
Figure 3:
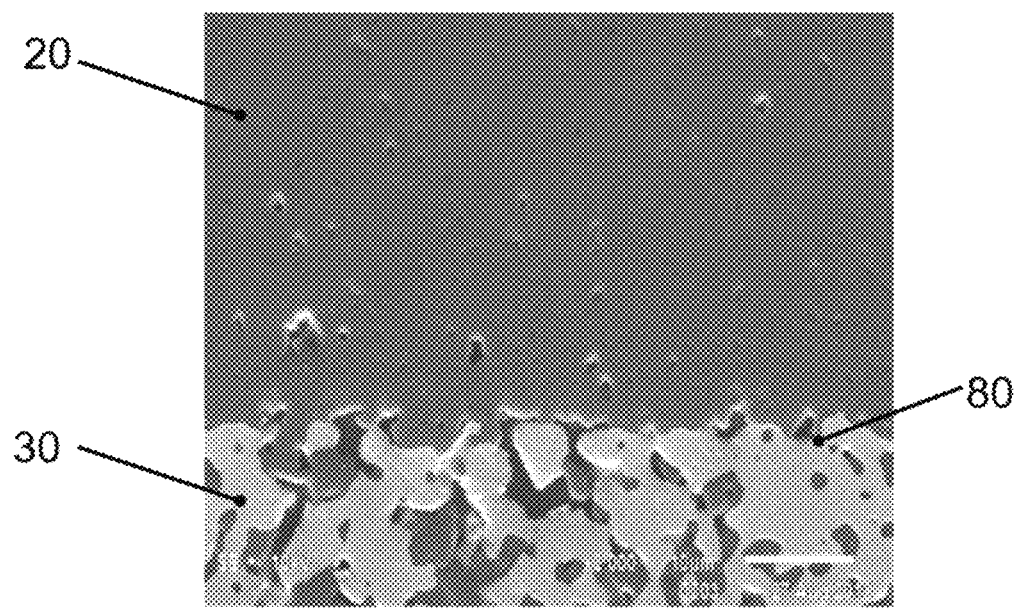
FIG. 3 is a magnified SEM image of FIG. 2.

With reference to FIG. 2, the co-fired layer arrangement 10 comprises a dielectric layer 20 which contains small voids distributed therein. The top portion 70 of the dielectric layer 20 is expected to have a lower proportion of $Ta_2O_5$ relative to the interfacial region 80 between the dielectric layer 20 and the metallisation layer 30. The metallisation layer comprises sintered metallic particles and a glassy phase, some of which may have been part of the metallisation composition and some may have been derived from the $Ta_2O_5$ in the dielectric layer. The insulation layer 40 comprises a larger proportion of voids compared to the dielectric layer 30.

A magnified image of the interfacial region 80 illustrates the greater proportion of voids in this region compared to the bulk of the dielectric layer 20.

EXAMPLES

Samples

Sample E-1 has a composition of 99.5 wt % $Al_2O_3$ and 0.5 wt % $Ta_2O_5$. Other impurities are less than 0.1 wt %. $Ta_2O_5$ has a mean particle size of less than 1.0 µm, with a smaller particle size distribution (compared to $Al_2O_3$) assisting in the uniform dispersal of $Ta_2O_5$ in the $Al_2O_3$. E-1 has a density of 3.96 g/cm³.

Sample CE-1 is Al-995™ available from Morgan Advanced Ceramics (Hayward, CA), which has a composition of 99.5 wt % $Al_2O_3$ and 0.5 wt % of other materials (excluding $Ta_2O_5$) including, glass forming materials. CE-1 has a density of 3.91 g/cm³. The samples (E-1 and CE-1) were laminated at room temperature under 15 Kpsi pressure and then co-fired at 1575° C. for 2 hours in $H_2$.

Sample E-2 has a composition of 2.0 wt % $TiO_2$; 4.0 wt % $Ta_2O_5$; other impurities are less than 0.1 wt % and the remainder $Al_2O_3$. E-2 has a density of 3.96 g/cm³.

Sample CE-2 is a commercial composition, with Energy-dispersive X-ray Spectroscopy (EDS) analysis confirming the presence of a major $Al_2O_3$ component with minor components of $TiO_2$; MgO, CaO and $SiO_2$. CE-2 has a density of 3.85 g/cm³.

The samples (E-2 and CE-2) were laminated at room temperature under 15 Kpsi pressure and then co-fired at 1600° C. for 2 hours in $H_2$.

Corrosive Resistance and Flexural Strength

Figure 4:
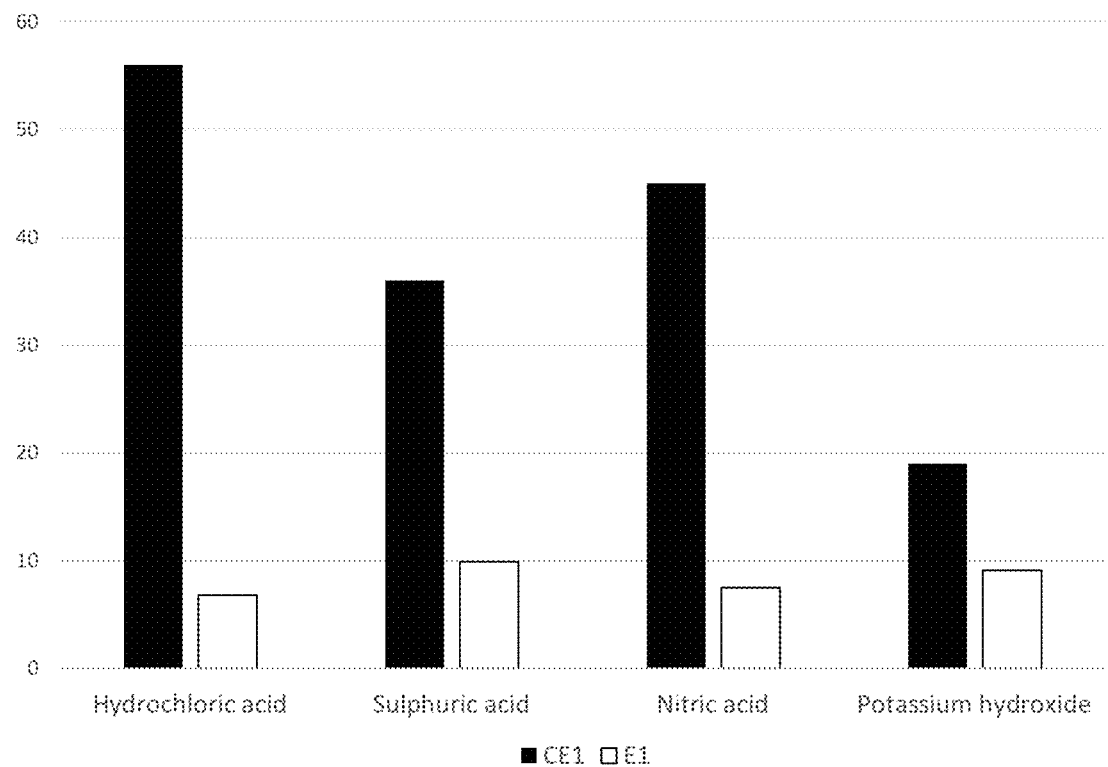
FIG. 4 is a graph of the weight loss ($\times 10^{-4}$ g/cm$^2$) of an $Al_2O_3$—$Ta_2O_5$ composition post corrosion test.
Figure 5:
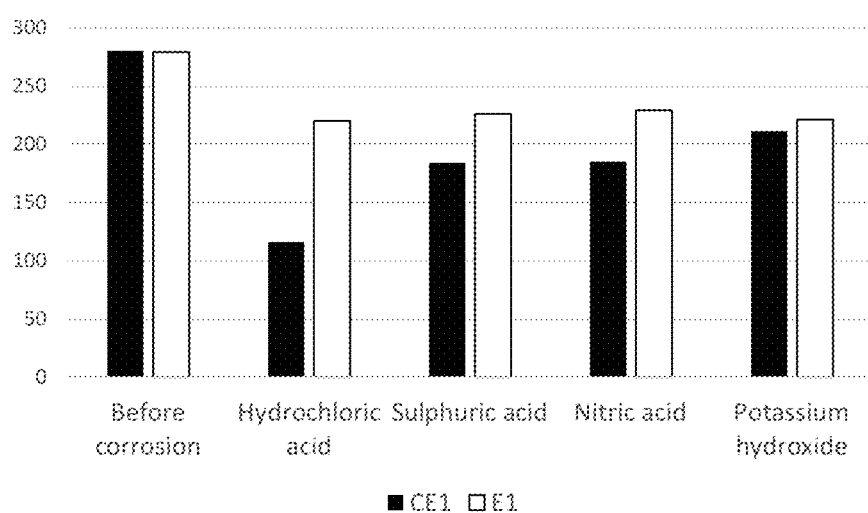
FIG. 5 is the flexural strength (MPa) of an $Al_2O_3$—$Ta_2O_5$ composition post corrosion test.
Figure 6:
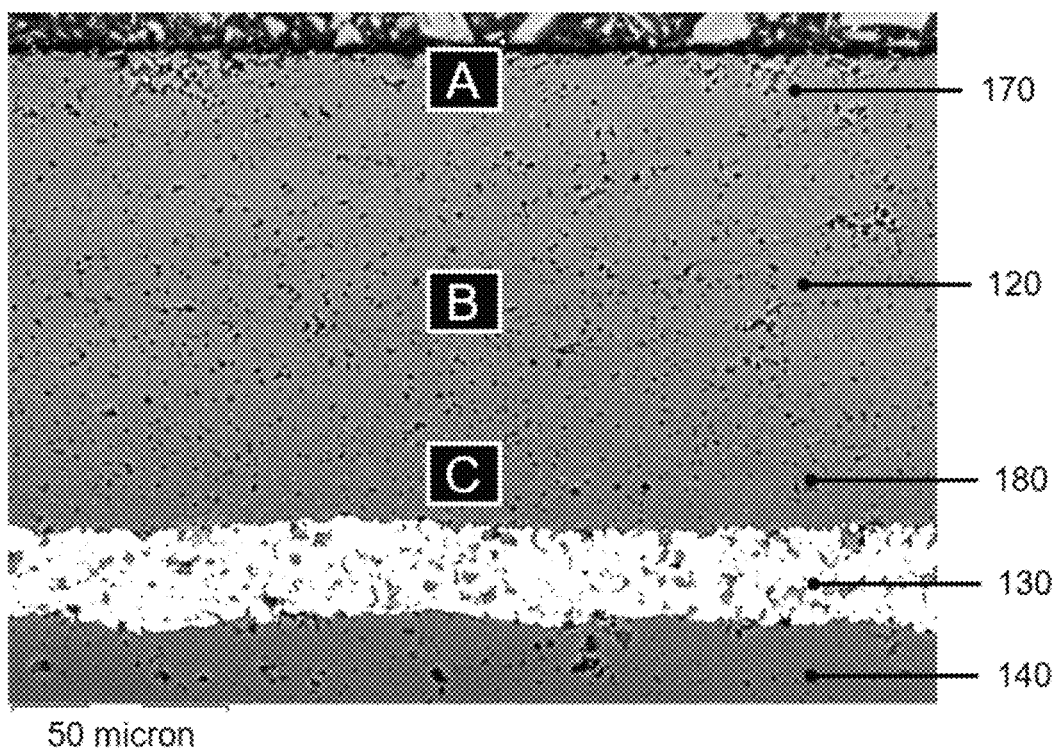
FIG. 6 is an SEM image of a cross-section of the layer arrangement.
Figure 7:
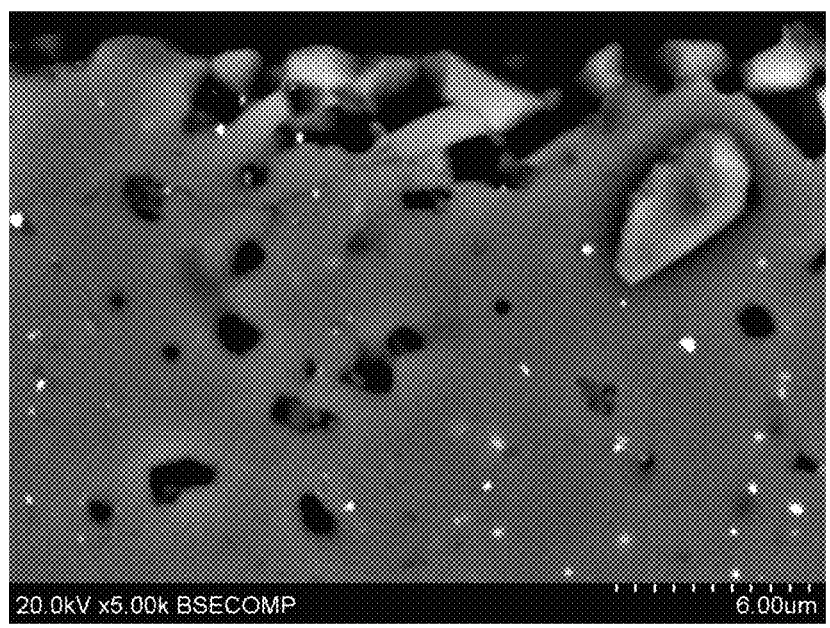
FIG. 7 is a SEM image of a cross section of the top portion of the dielectric layer.
Figure 8:
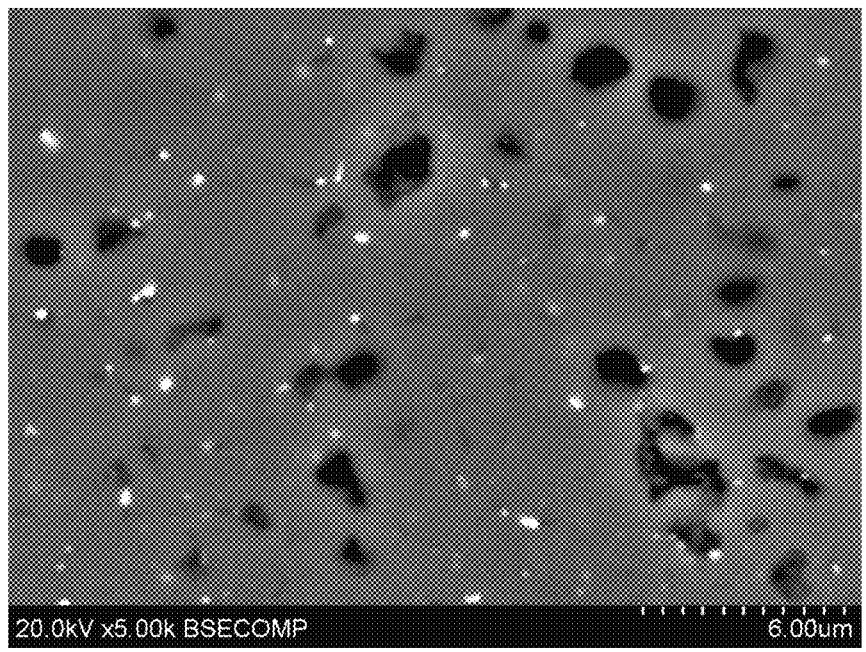
FIG. 8 is a SEM image of a cross section of the middle portion of the dielectric layer.
Figure 9:
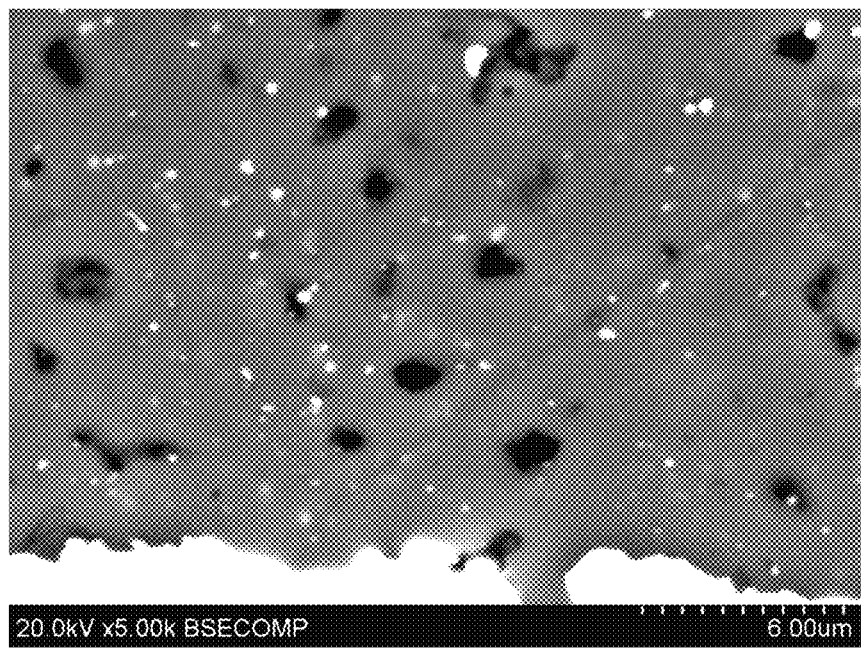
FIG. 9 is a SEM image of a cross section of the bottom portion of the dielectric layer.

Samples of CE1 and E1 of known weight and flexural strength and each with an average sample surface area of 15.5 cm² were placed in a Teflon™ test vessels with 150 ml of aqueous hydrochloric acid, sulphuric acid, nitric acid or potassium hydroxide solutions each at a concentration of 20% v/v at 90° C. for 11 weeks. The samples were then reweighed and retested for flexural strength with the average results provided in FIGS. 4 & 5.

The results demonstrate the improved corrosion resistance and flexural strength of sample E-1 (Alumina-$Ta_2O_5$) compared to the sample CE-1 (Alumina-MgO-Silica).

Dielectric Properties

Sample E-1

The breakdown voltage was determined at room temperature in accordance with ASTM D149. The results (Table 1) indicate that the $Al_2O_3$—$Ta_2O_5$ dielectric layer has well over twice the breakdown voltage compared to conventional high purity alumina dielectric layers, thereby enabling thinner dielectric layers to be used.

TABLE 1

| Thickness (Mil) | Breakdown voltage (V) | Breakdown voltage (V/mil) [V/µm] |
|---|---|---|
| 5.5 | 9759 | 1774 [69.8] |
| 5.5 | 9959 | 1774 [69.8] |
| 5.5 | 11002 | 2000 [78.7] |
| 5.5 | >11000 | 2000 [78.7] |
| 5.5 | >11000 | 2000 [78.7] |
| Average | 10543 | 1910 [75.2] |

Sample CE-1 has a reported dielectric breakdown voltage of 800 V/mil at room temperature.

The breakdown voltage was also determined in an ESC comprising a top dielectric layer comprising 99.8 wt % alumina (Al998™ from Morgan Advanced Ceramics) processed under the same conditions as E-1 and CE-1. The density was 3.92 g/cm³ and breakdown voltage varied between 569 and 943 V/mil with an average of 741 V/mil.

TABLE 2

| Thickness (Mil) | Breakdown voltage (V) | Breakdown voltage (V/mil) [V/µm] |
|---|---|---|
| 7.0 | 6659 | 951 [37.5] |
| 7.0 | 6582 | 940 [37.0] |
| 7.0 | 6418 | 917 [36.1] |

TABLE 2-continued

| Thickness (Mil) | Breakdown voltage (V) | Breakdown voltage (V/mil) [V/μm] |
|---|---|---|
| 7.0 | 8044 | 1149 [45.2] |
| Average | 6926 | 989 [38.9] |

CE-2 had a breakdown voltage of 11V/μm.

The volume resistivity of E-2 was $2 \times 10^{-11}$ ohm cm compared to $1 \times 10^{-11}$ ohm cm of CE-2.

The layer arrangement herein is able to provide greater breakdown voltage (Table 2), corrosion resistance; and density compared to conventional electrostatic charge dissipative material of the prior art (e.g. U.S. Pat. No. 6,641,939).

Densification of the First Ceramic Layer

The samples were process as previously described, except that the sintering temperature and time was adjusted. The density of the first ceramic layer was affected by the temperature and the duration of time maintained at the sintering temperature. As indicated in Table 3, a combination of sintering temperature and time effect the densification process. If the sintering temperature is sufficiently high, then time may be the limiting factor for the liquid phase to penetrate the void spaces and increase densification.

TABLE 3

| Sintering Temperature (° C.) | Time (hr) | Density (g/cm³) [% theoretical*] |
|---|---|---|
| 1600 | 2 | 3.96 [99.25%] |
| 1530 | 2 | 3.95 [99.00%] |
| 1530 | 0.5 | 3.89 [97.49%] |

*the density of $Al_2O_3$ is taken to be 3.99 g/cm³

Distribution of Tantalum in the First Ceramic Layer

With reference to FIGS. 6-9, the concentration of $Ta_2O_5$ was determined in the top dielectric at a cross sectional area proximal the surface 170 (sample (A)); a cross sectional area in the middle of the dielectric layer 120 (sample (B)); and a cross sectional area at the bottom of the dielectric layer 180 (sample (C)), proximal the metallisation layer 130. No substantial amounts of $Ta_2O_5$ was found in the second ceramic layer 140, although its presence may be more likely where the first and second ceramic layers interface, rather than being separated by the metallic electrostatic chuck electrode pattern 130.

Figure 10:
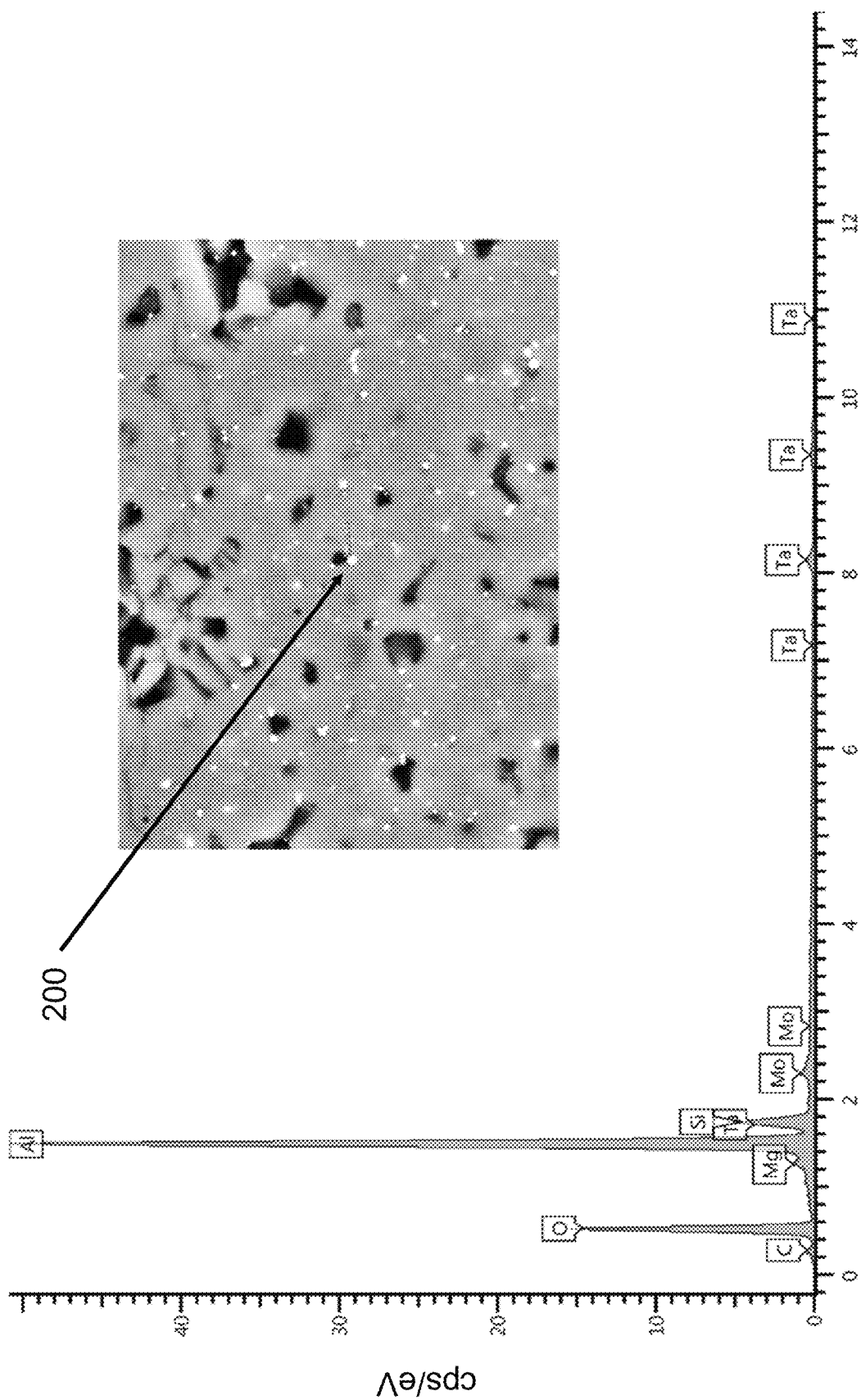
FIG. 10 is a SEM image and EDS spectra highlight the presence of a tantalum phase in the dielectric layer.

The cross-sectional surface areas of the components of the dielectric layer were determined using ImageJ™, an image processing software tool. The void space and artefacts in the images (identified as black) were excluded from the total cross-sectional area. The graphical data was then converted to a binary format (white—tantalum portion; black—other) using a threshold based on the tone of the tantalum portion, with the composition verified from corresponding EDS spectrum, as indicated in the verification of a tantalum phase in Sample B (FIG. 10). The proportion of black to white pixels was then used to calculate the cross-sectional area proportions of the tantalum portion at the top (A), middle (B) and bottom (C) of the dielectric layer.

Figure 11A:
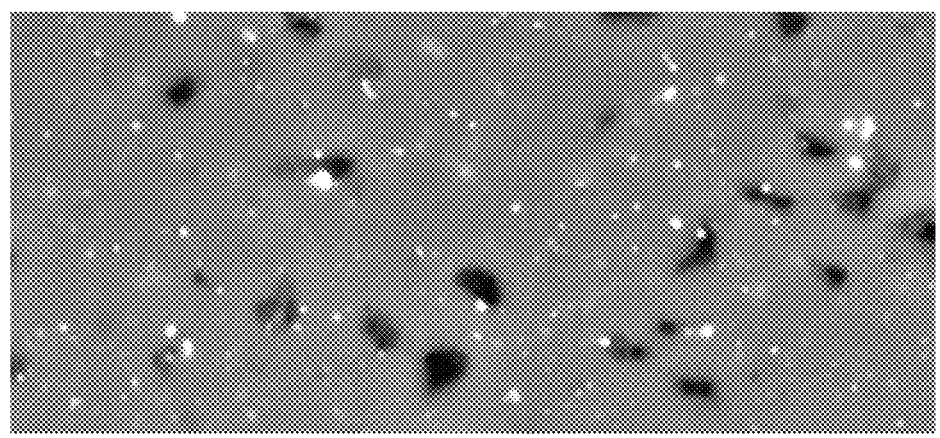
FIGS. 11a-c are a section of the SEM image of FIG. 9 which has been processed with the digital imaging software.
Figure 11B:
Figure 11C:

The image analysis process of Sample (C) is illustrated in FIGS. 11a-c, with the sample image area (FIG. 11a), initially screened to remove voids and artefacts (FIG. 11b) with the image processing tool then used to identify the identified (FIG. 11c) tantalum phase cross-sectional area (white) relative to the remaining area (excluding the voids and artefact areas identified in FIG. 11b). The same processing steps were used in the calculation of the cross-sectional area of the tantalum phase in Samples (A) and (B).

A sample cross sectional area of approximately 312 μm² (26 μm×12 μm) at a maximum point of no more than 30 μm from the metallisation layer for (C) and a maximum point of no more than 30 μm from the dielectric layer surface for (A)) was used to analyse the top (A), middle (B) and bottom (C) sections of the dielectric layers, with the results illustrated in Table 4 using EDS analysis. As illustrated in Table 4, the proportion of tantalum (relative to the total effective area of the sample, i.e. the total sample area minus the sample area taken up by voids and artefacts) was highest at the bottom (C) of the dielectric layer and the proportion of tantalum gradually decreased towards the top of the dielectric layer (A). This is referenced in the SEM images of sample area A (FIG. 7); sample area B (FIG. 8) and sample area C (FIG. 9), with considerably more $Ta_2O_5$ phases (speckled white phases) in FIG. 9, above the metallisation layer 130.

TABLE 4

| Dielectric layer position | Cross-sectional area of Ta Phase | % change from (A) |
|---|---|---|
| Top (A) | 0.29% | — |
| Middle (B) | 0.50% | 172% |
| Bottom (C) | 0.73% | 252% |

Reference throughout this specification to "one embodiment," "certain embodiments," "various embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in various embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein provided a description with reference to particular embodiments, it is to be understood that these embodiments are merely illustrative of the principles and applications of the disclosure. It will be apparent to those skilled in the art that various modifications and variations can be made to the present disclosure without departing from the spirit and scope thereof. Thus, it is intended that the present disclosure include modifications and variations that are within the scope of the appended claims and their equivalents.

The invention claimed is:

1. A layer arrangement for an electrostatic chuck comprising:
    (A) a first ceramic layer;
    (B) a second ceramic layer;
    (C) a metallised layer disposed between the first and second ceramic layers,
  wherein the first ceramic layer comprises:
    at least 90.0 wt % alumina, titania, $ZrO_2$, $Y_2O_3$, AlN, $Si_3N_4$, SiC, transition metal oxides or combinations thereof; and
    in the range of 0.1 to 10.0 wt % tantalum oxide ($Ta_2O_5$);
  wherein a $Ta_2O_5$ concentration at or proximal to a top surface of the first ceramic layer is lower than a $Ta_2O_5$ concentration at or proximal to an interface of the first ceramic layer and the metallised layer, and a cross sectional area of a $Ta_2O_5$ phase in the first ceramic layer proximal the metallisation layer is more than 20% greater than a cross sectional area of a $Ta_2O_5$ phases in the first ceramic layer proximal a top surface of the first ceramic layer.

2. The layer arrangement according to claim 1, wherein the first ceramic layer is a top dielectric layer.

3. The layer arrangement according to claim 2, wherein the top dielectric layer has a thickness in the range of 20 μm to 200 μm.

4. The layer arrangement according to claim 1, wherein the first ceramic layer comprises at least 98 wt % alumina.

5. The layer arrangement according to claim 1, wherein the first ceramic layer comprises at least 99.0 wt % of a total of the tantalum oxide, alumina, titania, $ZrO_2$, $Y_2O_3$, AlN, $Si_3N_4$, SiC, and transition metal oxides.

6. The layer arrangement according to claim 1, wherein the metallisation layer comprises a metal selected from the group consisting of: platinum, palladium, tungsten, molybdenum, niobium, tantalum and alloys thereof.

7. The layer arrangement according to claim 1, wherein the second ceramic layer comprises alumina, titania, $ZrO_2$, $Y_2O_3$, AlN, $Si_3N_4$, SiC, or combinations thereof.

8. The layer arrangement according to claim 1, further comprising a $Ta_2O_5$ phase at an interface of the first ceramic layer and the metallised layer.

9. The layer arrangement according to claim 1, wherein density of the first ceramic layer is greater than 97% of a theoretical maximum density thereof.

10. The layer arrangement according to claim 1, wherein a density of the second ceramic layer is lower than a density of the first ceramic layer.

11. The layer arrangement according to claim 1, wherein the first ceramic layer comprises an electrostatic charge dissipative material comprising alumina doped with a transition metal oxide and between 0.5 wt % and 10.0 wt % $Ta_2O_5$, wherein the transition metal oxide is present in an amount ranging from 1.0 wt % and 8.0 wt % based upon a total weight of ceramic material in the first ceramic layer.

12. The layer arrangement according to claim 11, wherein the transition metal oxide comprises titania ($TiO_2$).

13. The layer arrangement according to claim 11, wherein the first ceramic layer comprises between 2.0 wt % and 6.0 wt % $Ta_2O_5$.

14. The layer arrangement according to claim 1, wherein the layered arrangement is a co-fired layered arrangement.

15. An electrostatic chuck comprising the layer arrangement according to claim 1.

16. An electrostatic chuck according to claim 15, wherein the first ceramic layer has a breakdown voltage of at least 60 V/μm.

17. A layer arrangement for an electrostatic chuck comprising:

(A) a first ceramic layer;
(B) a second ceramic layer;
(C) a metallised layer disposed between the first and second ceramic layers, wherein the first ceramic layer comprises an electrostatic charge dissipative material comprising alumina doped with a transition metal oxide and between 2.0 wt % and 10.0 wt % $Ta_2O_5$, wherein the transition metal oxide is present in an amount ranging from 1.0 wt % and 8.0 wt % based upon the total weight of the ceramic material in the first ceramic layer, and a $Ta_2O_5$ concentration at or proximal to a top surface of the first ceramic layer is lower than a $Ta_2O_5$ concentration at or proximal to an interface of the first ceramic layer and the metallised layer.

18. The layer arrangement according to claim 17, wherein the alumina doped with a transition metal oxide accounts for at least 90 wt % of the first ceramic layer.

19. A layer arrangement for an electrostatic chuck comprising:

(A) a first ceramic layer;
(B) a second ceramic layer;
(C) a metallised layer disposed between the first and second ceramic layers,
wherein the first ceramic layer comprises:
at least 90.0 wt % alumina, titania, $ZrO_2$, $Y_2O_3$, AlN, $Si_3N_4$, SiC, transition metal oxides or combinations thereof; and
in the range of 0.1 to 10.0 wt % tantalum oxide ($Ta_2O_5$);
wherein a $Ta_2O_5$ concentration at or proximal to a top surface of the first ceramic layer is lower than a $Ta_2O_5$ concentration at or proximal to an interface of the first ceramic layer and the metallised layer.

20. The layer arrangement according to claim 19, wherein the first ceramic layer comprises an electrostatic charge dissipative material comprising alumina doped with a transition metal oxide and between 0.5 wt % and 10.0 wt % $Ta_2O_5$, wherein the transition metal oxide is present in an amount ranging from 1.0 wt % and 8.0 wt % based upon a total weight of ceramic material in the first ceramic layer.

21. The layer arrangement according to claim 19, wherein the first ceramic layer is a top dielectric layer.

22. The layer arrangement according to claim 21, wherein the top dielectric layer has a thickness in the range of 20 μm to 200 μm.

23. The layer arrangement according to claim 19, further comprising a $Ta_2O_5$ phase at an interface of the first ceramic layer and the metallised layer.

24. The layer arrangement according to claim 19, wherein density of the first ceramic layer is greater than 97% of a theoretical maximum density thereof.

25. The layer arrangement according to claim 19, wherein a density of the second ceramic layer is lower than a density of the first ceramic layer.

* * * * *